US006333674B1

(12) United States Patent
Dao

(10) Patent No.: US 6,333,674 B1
(45) Date of Patent: Dec. 25, 2001

(54) FEEDBACK STABILIZATION APPARATUS AND METHODS

(76) Inventor: Kim Dao, 12 Nace Ave., Piedmont, CA (US) 94611-4326

( * ) Notice: Subject to any disclaimer, the term of this patent is extended or adjusted under 35 U.S.C. 154(b) by 0 days.

(21) Appl. No.: 09/809,395

(22) Filed: Mar. 15, 2001

(51) Int. Cl.[7] ....................................................... H03F 1/36
(52) U.S. Cl. .............................. 330/86; 330/282; 330/305
(58) Field of Search ............................... 330/86, 282, 290, 330/305, 306, 284, 134, 303; 381/121, 94.1–94.9; 333/174; 331/182, 183; 327/554

(56) References Cited

U.S. PATENT DOCUMENTS

| | | | |
|---|---|---|---|
| 3,475,702 | * 10/1969 | Ainsworth | 333/17 |
| 5,222,149 | 6/1993 | Palmer | 381/94 |
| 5,392,456 | * 2/1995 | Mitomo et al. | 455/38.3 |
| 5,475,337 | 12/1995 | Tatsumi | 327/551 |
| 5,825,250 | 10/1998 | Tomasini et al. | 330/292 |
| 6,035,049 | 3/2000 | Engh et al. | 381/121 |
| 6,181,215 | * 1/2001 | Kuttner | 331/116 FE |
| 6,239,654 | * 2/2001 | Yamamoto | 330/9 |

* cited by examiner

Primary Examiner—Robert Pascal
Assistant Examiner—Henry Choe

(57) ABSTRACT

An apparatus (Z) having controllable impedance is inserted from output (22) to ground (23) of an audio-signal amplifier (20). Typically, the apparatus comprises a diode-chain (50) having multiple steps (52, 53, and so on); its first step (52) is connected to one terminal (62) of the apparatus. A capacitor (82, 84, and so on) is connected from each step to a second terminal (61). The network formed by the diode-chain (50) and the capacitor network (80) is called a matrix (60C). To bypass audio frequencies away from the chopping effect of the diodes, an inductor (31) parallels the matrix. To prevent shorting of audio signals to ground, a larger capacitor (30) is in series with the inductor. An unstable voltage at output will see increasing capacitance as it gradually breaks over more and more diodes. The changing of capacitive impedance in relation to the amplitude of the unstable voltage is designed such that the unstable voltage cannot grow too large. More complex matrices further reduce voltage fluctuations. Logic circuits controlling transistor switches can realize better stabilization.

6 Claims, 6 Drawing Sheets

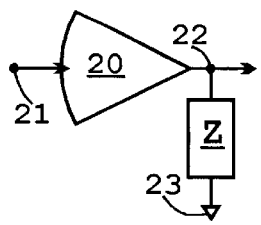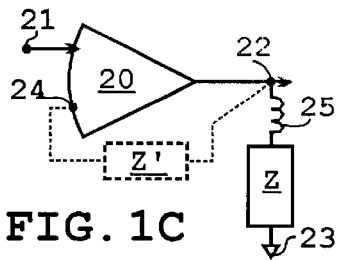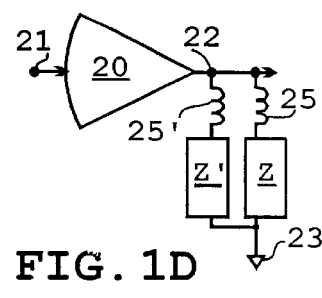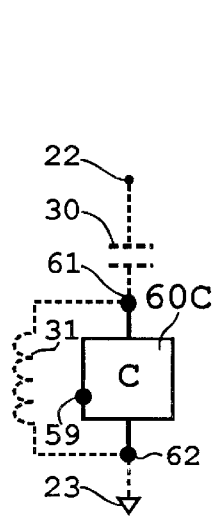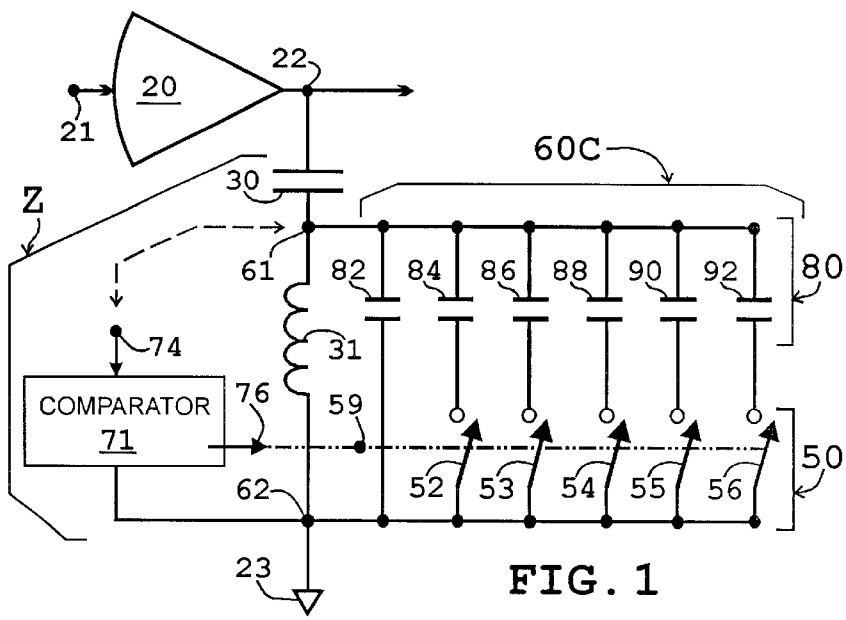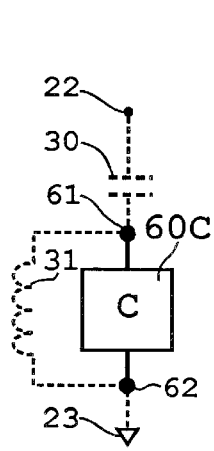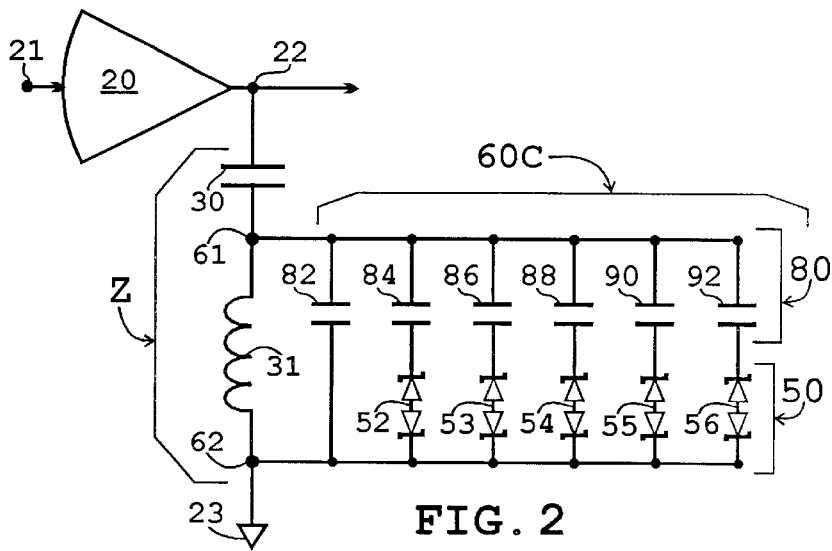

FEEDBACK STABILIZATION APPARATUS AND METHODS

CROSS-REFERENCE TO RELATED APPLICATION

"Not applicable".

STATEMENT REGARDING FEDERALLY SPONSORED RESEARCH OR DEVELOPMENT

"Not applicable".

REFERENCE TO A MICROFICHE APPENDIX

"Not applicable".

FIELD OF INVENTION

This invention relates to methods and apparatus for stabilizing feedback control systems, having particular application in audio-signal amplifiers.

BACKGROUND OF THE INVENTION

Commercially available electronic sound systems are known to reproduce music that lacks the musicality of live performances. More expensive audio systems reproduce slightly better music, but are still unsatisfactory. Components of electronic sound systems include power amplifiers, pre-amplifiers, and program players. They are, in essence, electronic amplification systems using closed-loop control principle or feedback-controlled amplifiers for short.

The signal distortion that reproduces bad music comes from many causes. Major causes are nonlinear transfer function of electronic circuits (such as crossover distortion), feedback instabilities and speaker imperfections. Feedback instabilities are most difficult to understand. They are transient and not easily observable on a test bench using resistive loads and steady state input signals. They do occur during operation with real speakers and transient musical signals.

Because of the difficulty in observation and understanding of instabilities, designers do not recognize the problem. Previous circuits for stabilization comprise resistor-capacitor networks that remain basically the same for years. They are experimentally designed to suppress oscillations observed on bench testing. They comprise mainly a compensation capacitor that rolls off high frequency gain. This capacitor is connected from output to feedback terminal. Power amplifiers often have a damping inductor termination at the output; followed by a series resistor-capacitor connected to ground. Capacitors are also connected from collector to base of bipolar transistors, and resistors inserted to base and emitter. They offer little help in reducing transient instabilities.

Recently U.S. Pat. No. 5,825,250 (1998) to Tomasini, et al. disclosed a selectively switched capacitor network to replace the conventional fixed-value compensation capacitor. The purpose is to match the compensation capacitor to the closed-loop gain. When the feedback resistor changes value, the compensation capacitor network would switch to a new value to ensure sufficient stable bandwidth. This variable compensation may extend the bandwidth a little but is still the old fashion frequency compensation that will not prevent transient instabilities. Further more, amplifiers that use fixed closed-loop loop gain, such as audio amplifiers do not need variable compensation. The problem is deeper than that, as will be explained in the detailed description of the present invention.

Unaware of transient instabilities, designers of sound systems addressed other problems without improving sound quality:

1. Problems such as suppression of noises and electromagnetic interferences that may pollute input signals and power supplies. As sound quality is concerned, commercially available boxes offering to cleanup AC power sources are unsatisfactory.
2. Recently, problems resulted from transmission line effects are addressed in U.S. Pat. Nos. 4,885,555 (1989) and 5,222,149 (1993), both to Palmer. The apparatus disclosed by Palmer are essentially terminations using transformer effect either for impedance matching or for dissipation of ringing signals in the transmission line. The primary circuit is the signal carrying line and the secondary circuit is shorted. The apparatus are located at strategic locations along the transmission line for proper dissipation of ringing signals. Commercially available speaker cables and interconnects having complex woven patterns also produce expensive and unsatisfactory audio accessories. They are also designed to manipulate standing waves in cables considered as transmission lines.
3. Methods for improving sound quality also include selection of parts. Selection of parts often calls for exotic devices that bring about small improvement. Examples of exotic devices include special vacuum tubes, pure resistors, low-dissipation capacitors, oxygen-free copper, silver wires, gold-plated terminals. Sound quality improvement may exist between a low cost solid-state amplifier and an expensive tube amplifier. However, the small improvements cannot justify additional costs, except for a few wealthy people.
4. A very expensive speaker may sound a little better than the one costing half as much. However, the expensive speaker falls into the range of extreme diminishing return.

In conclusion, prior arts were unsatisfactory for improvement of sound quality and did not address an important cause of distortion, namely feedback instabilities.

The present invention addresses the problem of amplifier feedback instabilities uncorrected by conventional stabilization.

OBJECTS AND ADVANTAGES

It is a primary object of the invention, therefore, to provide a system for improving stability of feedback-controlled amplifiers, particularly to enrich the musicality of audio-signal amplifiers. Other objects and advantages are:

To provide a cost-effective system for improving sound quality,

To provide an add-on system for speaker terminals and output jacks of program players of sound systems already in use.

Still further objects and advantages will become apparent from a consideration of the ensuing description and drawings.

BRIEF SUMMARY OF THE INVENTION

In accordance with the present invention a method for stabilizing feedback-controlled amplifiers comprises inserting an apparatus having controllable impedance, typically, from output to ground, and applying an unstable signal (typically, the unstable output voltage itself) to control the impedance toward values where instabilities are reduced (or they cannot grow larger).

Typically the apparatus is a network having multiple configurations selected by switches. Each configuration has properly designed impedance. Switches are typically threshold switches such as diodes, zeners, but they can be transistor switches controlled by unstable signals toward configurations designed to minimize unwanted oscillations. The unstable signals should control the switches through the intermediary of a computer code that can provide prediction capability to act earlier, at the onset of instabilities.

BRIEF DESCRIPTION OF THE DRAWINGS

FIG. 1 shows a basic construction of apparatus Z.

FIG. 1A shows a shorthand representation of a matrix constituent of apparatus Z, needed for clarity of many Figures.

FIG. 1B shows an apparatus Z in a typical location in an amplifier circuit.

FIG. 1C shows example of added components. Also apparatus Z' can be in a different location.

FIG. 1D shows the use of many apparatus tuned to different frequency ranges.

FIG. 2 shows a simple zener diodes embodiment of apparatus Z.

FIG. 2A shows a shorthand representation of a matrix constituent of apparatus Z, needed for clarity of many Figures.

REFERENCE NUMERALS AND LETTERS IN DRAWINGS

Figure 2B:
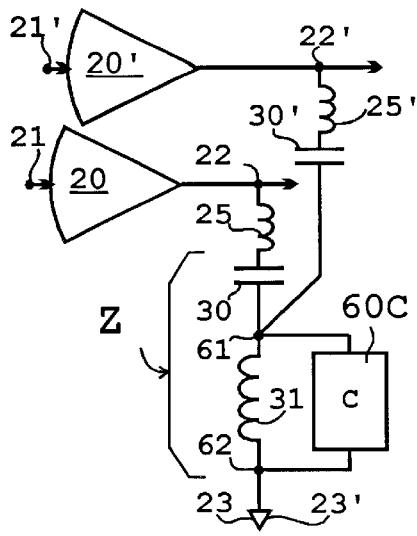
FIG. 2B shows sharing one apparatus Z with many amplifiers.

Z apparatus having controllable impedance
20, 20' amplifier
21, 21' input terminal
22, 22' output terminal
23, 23' ground terminal
24 feedback terminal
25, 25' example of additional components connected to apparatus Z
30, 30' to 36 auxiliary components
50 switch-chain of a matrix
51 to 56 each switch, a pair of diodes, or a transistor
59 control terminals of transistors
60- matrix, the dash- will be replaced by component type,
60C, 60C1, 60C2 capacitor matrices
60L inductor matrix, 60R resistor matrix, 60LCR combination
61 a terminal of a matrix
62 another terminal of a matrix
70 a generalized processor: a computer or a pattern generator
71 array of voltage comparators
72 analog-to-digital (A/D) converter
73 computing code using LOGIC circuits
74 input terminals of 72 (or of 71) (or of 70)
76 outputs of 73 (or of 71) (or of 70)
80 element network of a matrix 60-
82 to 93 elements, typically capacitors C
Elements can be inductor L, resistor R and a combination LCR.

DETAILED DESCRIPTION OF THE INVENTION

Guiding Theory for the Invention

Before discussion of methods and apparatus, it is helpful to understand the guiding principle of the invention.

To designers of amplifiers, the following formula is familiar:

$$G=A/(1+A\times F)$$

Where:
G is the closed-loop gain=Vout/Vin
Vout is the output voltage
Vin is the input voltage
A is the forward gain=Vout/(Vin−Vfb)
Vfb is the feedback voltage; (Vin−Vfb) is the error
F is the feedback fraction=Vfb/Vout
A×F is the open-loop gain=Vfb/(Vin−Vfb)

At a frequency fc, the open-loop gain may become −1, meaning its modulus is 1 and its phase is −180 degrees with respect to Vin. If this happens, G becomes infinity because the denominator is zero. This condition is positive feedback, meaning Vfb keeps on adding to Vin such that the error keeps on growing. Any non-zero Vin at fc will be amplified and growing beyond control.

If A depends only on frequency, then, frequency dependent components can be added to modify F such that the equation A×F=−1 has no solution in terms of frequency. And stability is restored. This has been the conventional strategy for stabilization. F is modified by a well-matched compensation capacitor, in parallel with the feedback resistor.

However, in reality, A depends also on other parameters such as transistor transient currents, voltages or even instantaneous junction temperatures. The consequence is that equation A×F=−1 will have solutions when the parameters shift to opportune values, regardless of prior-art stabilization components.

A remedy for shifting A is disclosed in the present invention. Basically the method recommends that stabilization components must be controllable to catch up with shifting parameters. If the parameters are unknown or difficult to compensate, then the unstable voltage itself can be used for controlling stabilization components. At least the growth of instabilities can be limited. In the following sections, signals derived from the monitoring of shifting parameters that cause instabilities and the resulting unstable voltages are called collectively as unstable signals.

Therefore, the method comprises inserting controllable impedance into the circuitry of the open-loop gain and letting the unstable signals control the impedance negatively, meaning to reduce the growth of unstable voltages. To accomplish this, for interdependent tasks are needed:

(a) Design a network that can change impedance, (b) Select an effective location to insert the network into the open-loop circuitry, (c) Select an effective unstable signal to control the impedance, (d) Determine a stabilization relationship between impedance and the unstable signal.

In principle, every amplifier has its own optimum stabilization relationship. Optimum means fluctuations of unstable voltages are most reduced. Tasks (a) to (d) aim for closest approximation to the optimum stabilization relationship. Presently, the relationship is unknown and task (d) must be performed by time-consuming experimentation. But in the future, the relationship may be known from mathematical analysis of the amplifier, taking into account relevant parameters.

Networks having controllable impedance were used for gain control, offset adjustment, frequency compensation. However, none suggested using unstable signals to control the networks. The wrong controlling signal will not stabilize the amplifier. The following detailed description concerns a proven satisfactory way to stabilize amplifiers. Details discussed include:

how to construct an apparatus having controllable impedance, where are effective locations for the apparatus and to pickup an unstable signal, and how to determine experimentally an effective relationship.

Description—FIGS, 1, 1A, 1B, 1C, 1D

Figure 3A:
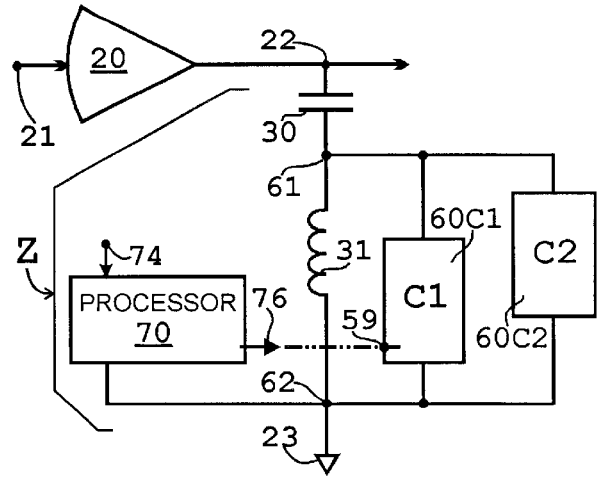
FIG. 3A shows a combination diode matrix and digital-controlled matrix.
Figure 3:
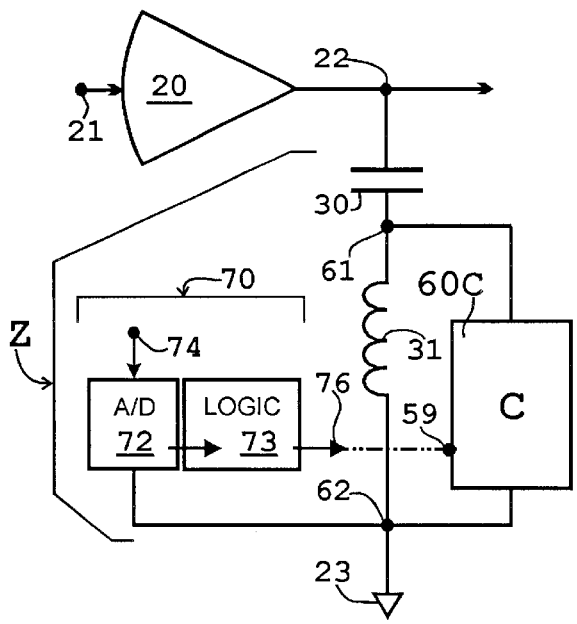
FIG. 3 shows a digital-computer embodiment of apparatus Z.
Figure 4:
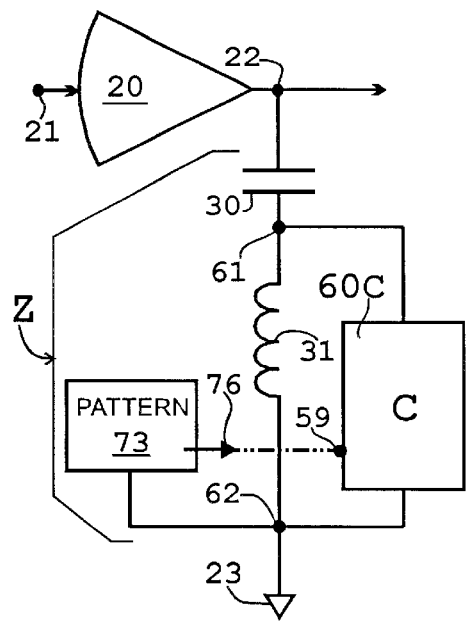
FIG. 4 shows control of impedance by internal pattern generator.
Figure 5:
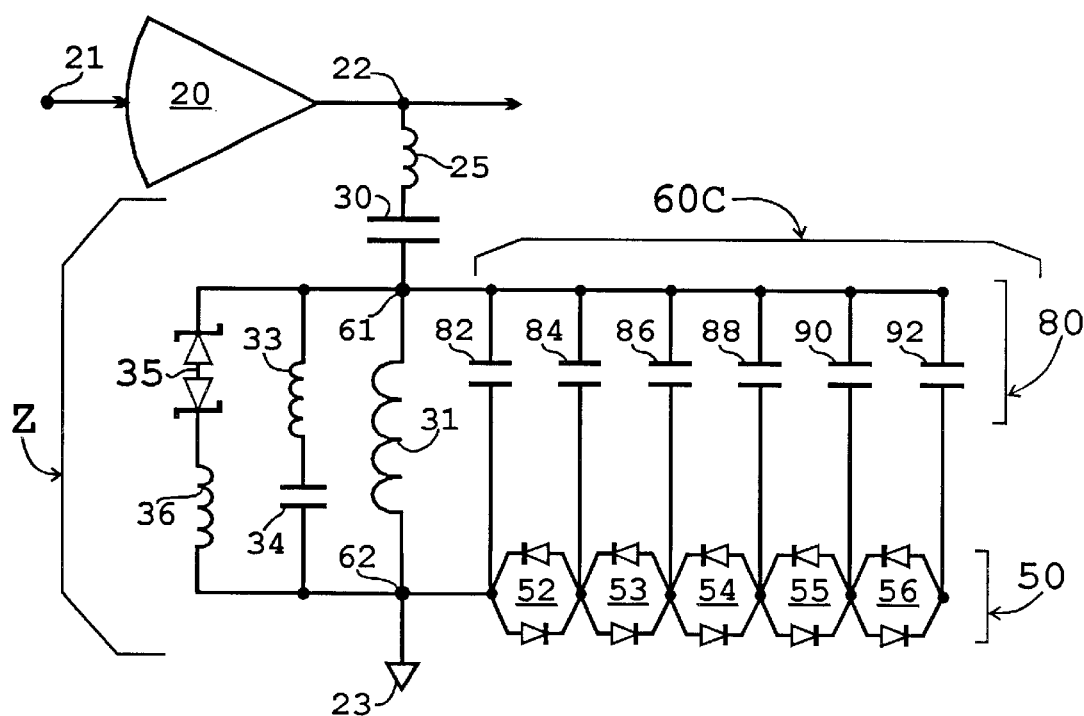
FIG. 5 shows a typical preferred embodiment of apparatus Z, using pairs of diodes and having more auxiliary components.

FIG. 1 shows the basic embodiment of an apparatus Z having controllable impedance. This basic design is the foundation for other apparatus built to suit a design goal. FIGS. 2 and 5 are designed for cost effectiveness, FIG. 3 is designed for best sound quality and FIGS. 3A, and 4 are compromises between the two extremes.

FIG. 1 comprises:

a network having controllable impedance called a matrix, matrix 60C, auxiliary components: inductor 31 to bypass low (audio) frequencies away from the matrix and capacitor 30 to block low frequencies from conducting through the apparatus, an array of voltage comparators, called detector 71. An unstable signal is applied to terminal 74 of detector 71. The application of the unstable signal to terminal 74 is preferably through the intermediary of a high pass device to reject low (audio) frequencies. The comparators compare the signal to thresholds (or refernces), then produce an individual output but collectively named as outputs 76.

Conventional parts such as power supplies are not shown.

Auxiliary components are optional. They are included mostly to reduce jittering created by unavoidable switching of audio frequency currents. If such jittering is negligible (i.e. audio currents switched are small), inductor 31 can be deleted. When inductor 31 is absent, capacitor 30 may be redundant. Inductor 31 can also split into many inductors. Each can be connected in parallel to one switch for bypassing low frequencies away from each switch. This arrangement can eliminate capacitor 30 if the elements are capacitors, and it has the advantage of more effective blocking the return to ground of low frequencies. However, it is more expensive.

The linkage between outputs 76 and matrix 60C is the essence of the control of impedance by the unstable signal at 74. Matrix 60C comprises an element network 80 having typically capacitors as elements: 82, 84, 86, 88, 90, 92, and a switch-chain 50 having typically transistors as switches 52, 53, 54, 55, 56 (such as metal-oxide-silicon field-effect transistors, bipolar transistors). The gates (or bases) of transistors are shown collectively as control terminals 59. Analog switches are preferred, but other unidirectional transistor switches can be satisfactory. Designs for unidirectional switches must ensure proper removal of stored energy.

The parallel elements are connected to a terminal 61 of matrix 60C, and the parallel switches are connected to a terminal 62 of matrix 60C. The free end of each capacitor is connected to the free end of a corresponding transistor. The elements of element network 80 are typically capacitors but other devices may be used, such as inductors, resistors, diodes, optocouplers and so on.

When a control terminal 59 of a transistor receives a proper controlling signal it will close or open. Such controlling signal comes from an output 76 of a corresponding comparator. There are 5 switches and 5 comparators, as shown in FIG. 1. Capacitor 82 is always in conduction. Each comparator detects one level of unstable signal therefore the accuracy of detection depends on the number of comparators.

Comparators of detector 71 set the voltage scale of unstable signal. As the unstable signal fluctuates, the states (opened/closed) of the switches vary accordingly. The closed switch parallels one element to alter the configurations of matrix 60-. Therefore, there is one-to-one correspondence between the amplitude of the unstable signal and the identity of the parallel configurations of matrix 60-. Each configuration of matrix 60- corresponds to a value of its impedance. This one-to-one correspondence is the stabilization relationship.

The state of a switch is preferably either opened or closed because this allows a more accurate design of the element. But the switch can have a wide impedance range between open and close. Therefore, the definition of states should be understood in terms of impedance variation of the switch with respect to the amplitude of the controlling signal. Definitely, the selection of characteristics of switches influences the designed values of the elements.

Following is a discussion on the locations of apparatus Z in an amplifier circuit.

All components mentioned above belong to apparatus Z. It will be inserted in the circuitry of amplifier 20. Experimentation or mathematical analysis of the amplifier can determine suitable locations. A proven good location is between amplifier output 22 and ground 23. FIG. 1B shows such position of apparatus Z in an overall circuit comprising an amplifier 20 having input terminal 21. Internal amplifier circuitry and conventional input source and load are not shown. Also input terminal 74 of detector 71 is not shown as opened because it is connected to terminal 61 of matrix 60C. Such connection of terminal 74 to terminal 61 conforms to the assumption that the unstable voltage (at output 22) itself is the best available signal for controlling the impedance. However, other ways of connection are possible and should be explored.

How apparatus Z is inserted into the amplifier circuitry also remains to be explored because there are many ways to design and to affect the open-loop gain. Apparatus Z can be inserted between terminals 22 and 23 through the intermediary of (i.e. in series with) other components: such as an inductor, or a network in general. FIG. 1C shows an example of insertion of apparatus Z through intermediary of a component such as inductor 25. FIG. 1C also shows that apparatus Z' can be inserted from output 22 to feedback terminal 24. Cutting an existing path for the insertion of apparatus Z is another way of connecting Z to the circuit, for example, Z can be inserted between terminals 22 and 23 in series with the load.

To be consistent, in the following description, the word connection indicates a precise location and the word insertion used for connection of a network having at least two terminals to at least two locations in the overall circuit, with or without cutting and/or intermediary parts. In generality, the two terminals of the inserted apparatus are in communication with the two locations of the circuitry. These alternative insertions are not shown in figures because the description is already clear.

Intermediary networks are important when many apparatus Z, Z' are used, each apparatus can be tuned for a particular frequency range filtered by intermediary networks. As shown in FIG. 1D, inductors 25 and 25' filter the frequencies of signals passing through Z and Z'. Better frequency discriminating networks can replace simple network of one inductor.

FIG. 1A defines the shorthand representation of matrix 60C shown in FIG. 1. It illustrates the connections of such matrix in a circuit of apparatus Z. Shorthand representation is needed for clarity of many Figures. As shown in FIG. 1A, gates of transistors are a third set of multiple control terminals 59 of matrix 60C. Terminals 61 and 62 are its two main terminals. This matrix 60C will be called a transistor-capacitor matrix.

Description—FIGS. 2, 2A, 2B

As discussed in FIG. 1, input terminal 74 of detector 71 should be connected to terminal 61 because the best location for apparatus Z and the best signal for controlling impedance are believed to be at output 22 and ground 23. Then both switch and comparator see the same voltage. Therefore, a voltage regulator having the same threshold can replace them both. Not all voltage regulators can be used here, only the shunt-type such as zener diodes, transient voltage suppressors. Voltage regulators are used here as threshold switches, meaning to prevent current conduction into a component until the voltage reaches a predetermined value. Threshold switches 52, 53, 54, 55, 56 in FIG. 2 are constructed with zener diodes. They can be constructed with bipolar transistors having resistors connected from base to collector and to emitter. Threshold switches have a wide range of impedance therefore, the selection of characteristics of threshold switches influences the designed values of the elements. Threshold switches with sharp knees are preferable because it allows more precise design of the element.

When an unstable voltage at terminal 61 is applied to terminal 74, FIG. 1 and FIG. 2 operate exactly the same way, meaning, every time the unstable voltage reaches a higher threshold, the impedance decreases by one more element connected in parallel. FIGS. 1, 2 have the same matrix 60C, element network 80, switch-chain 50, inductor 31 and capacitor 30.

FIGS. 1 and 2 are shown in a preferred orientation where matrix 60C is seen by audio frequencies as ground because of the low impedance of inductor 31. The advantage of this orientation is the possibility of many amplifiers sharing the same apparatus Z. Indeed, in FIG. 2B, the outputs 22, 22' of two amplifiers can be connected to the same terminal 61 of one apparatus Z, by capacitors 30 and 30' or other summation networks. Of course, the grounds 23 and 23' should be connected together. FIG. 2B is applicable as well for matrices having terminals 59 because terminal 74 can be connected to both amplifiers, using capacitors or other summation networks. Channel separation remains high because at audio frequencies, the impedance of capacitors 30, 30' is much larger than the impedance of inductor 31. Inductors 25 and 25' can be added to isolate direct connection of high frequencies between output 22 and 22'. These inductors can share a same magnetic core to further increase the isolation, or better frequency discriminating networks can replace simple network of one inductor. If only one amplifier is involved, there is no preferred orientation.

FIG. 2A defines the shorthand representation of a matrix and illustrates the connections of such matrix in a circuit of apparatus Z, the only difference between FIGS. 1A and 2A is the absence/presence of control terminals 59. Matrix 60C here will be called a diode-capacitor matrix.

Description—FIGS. 3, 3A, 4

As explained above, the choice of location to pickup the signal to be applied to terminal 74 (of FIG. 1) influences the choice between FIG. 1 and FIG. 2. If the signal comes from terminal 61, then FIG. 2 is more cost effective. Assuming that there are better locations and better unstable signals to control the switches, then apparatus of FIG. 1 must be used. Therefore improvement to FIG. 1 should be considered, in the pursuit of better reproduction of sound.

First, FIG. 1 can be modified to reduce the number of switches for a needed increase in number of comparators. More comparators define the voltage scale more accurately. If an encoder is added to provide digital conversion, the 5-switch switch-chain of FIG. 1 can now accommodate 31 comparators for 32 voltage steps including 0. the combination comparator-encoder constitutes an analog-to-digital converter (A/D) 72 shown in FIG. 3.

Secondly, a LOGIC circuit 73 is added in FIG. 3 for more flexibility in the approximation of the optimum stabilization relationship. Values of capacitors can be determined by about equal spread between the 32 successive values obtained by 32 parallel configurations possible with different combinations of the states of the 5 switches: 52, 53, 54, 55, 56. Capacitor ratios can be fixed at 1, 2, 4, 8, 16 32 respectively for capacitors 82, 84, 86, 88, 90, 92. Then only one capacitor value need be determined in conjunction with a computing code (or instruction) for logic circuit 73. The code identifies a parallel configuration for each of the 32 voltage steps.

The combination of A/D converter 72 and logic circuit 73 will be called a computer 70. Computer 70 has inputs 74 and outputs 76. Theoretically, apparatus of FIG. 3 can reduce fluctuations of unstable voltages more than the apparatus of FIGS. 1 and 2 can because it has prediction capability provided by the possible monitoring of shifting parameters. These monitored data are applied to terminals 74, processed and digitized, then fed to a computing code preprogrammed into computer 70 for computing the states of the switches. Apparatus of FIG. 2 can only react to a growing unstable voltage. But apparatus of FIG. 3 can predict the coming of instabilities and acts earlier to suppress the onset of instabilities.

Other components of FIG. 3 are the same as for FIG. 1. FIG. 3 shows a sending and receiving line between logic outputs 76 and control terminals 59 of the switches. This communication can be simple wires or light by optical coupling (or electromagnetic by transformers). Indirect coupling by light should be desirable because it allows matrix 60-to be complex and mobile, resulting in broader choices of circuit designs for better stabilization.

The different degrees of processing of unstable signal: namely from simple comparator, analog-to-digital converter, to computer will be called collectively a processor. The processor has at least an input terminal where an unstable voltage is applied. It processes the input according to an instruction, then provides at least an output. The instruction can include spectrum analysis of the input to obtain information on amplitudes and frequencies, useful for controlling a set of frequency specific matrices.

FIG. 3A shows the possibility of combining the low cost of threshold switches and the flexibility of computer controlled transistor switches. A commercial construction of the apparatus may use the most that threshold switches can offer (diode-capacitor matrix 60C2) and supplementing the deficit by a simpler computer controlled transistor switches (transistor-capacitor matrix 60C1).

Another possible simplification of FIG. 3 is the elimination of the A/D converter. It is shown in FIG. 4. Indeed, the stabilization relationship may be approximated by some typical-unstable-pattern representation of unstable signals. An internal generator for typical-unstable-pattern signal may replace all real time inputs applied to terminals 74.

More reduction of cost may be possible for FIG. 4 because the generator of typical-unstable-pattern signal and circuits for providing outputs 76 need not be a computer, it can be simple conventional wave generators or simple gate arrays.

Description—FIG. 5

The design of FIG. 5 is functionally identical to FIG. 2, but it remedies a practical disadvantage of FIG. 2.

In practice, the steps between thresholds for changing impedance are small. Available thresholds for zener diodes are not small and accurate enough to construct such closely spaced voltage steps. The major difference between FIG. 2 and FIG. 5 is the replacement of parallel zener diodes with series connected pairs of reversed-parallel diodes (i.e. diodes connected in parallel with their polarities in opposite directions). If availability is not a problem, the two ways of building the voltage steps are equivalent.

Most of the overall description is already explained in FIG. 2. However, more practical details will be given because FIG. 5 represents most of the experimental works done.

Similarly to FIG. 1, apparatus Z of FIG. 5 can be divided into three groups of components: Switch-chain 50, Element network 80, and Auxiliary components 30, 31. The 3 groups constitute two sub-assemblies: a matrix 60- formed by (1) switch-chain and (2) element network, and auxiliary components.

When auxiliary components are not needed and are deleted, apparatus Z is identical to matrix 60-. Matrix 60- is the main body of apparatus Z that stabilizes high frequency oscillations.

1. Switch-chain 50 starts at a terminal 62 and continues as long as needed.

Each step 52, 53, 54, 55, 56 is typically a pair of reverse-parallel diodes. They are connected in series to form diode-chain 50. The more descriptive name of diode-chain will be used interchangeably with the name of switch-chain because it helps understanding.

To highlight the switching purpose of diodes in forward conduction and other devices, devices used for the steps 52, 53, 54, 55, 56 will be called threshold switches. The names of switch, step, diode pair, threshold switch will be used interchangeably when the more descriptive name helps better understanding. They all means the same component.

Schottky diodes such as 1N5819, BAT 42 can be chosen for diode-chains having each step of about 0.35 volt. Diodes such as 1N4936, 1N4148 can be chosen for diode-chains having each step of about 0.7 volt. Other devices may be used for the steps, but should be tested.

Preferably, threshold switches should be bi-directional. However, unidirectional devices may work either in singles, in reverse-parallel pairs, or in reverse-series pairs. Particularly, zener diodes (such as 1N4733A) may be used for large steps (about 5.8 v each) when connected in reverse-series and for small steps (about 0.7 v each) when connected in reverse-parallel. Used singly, 1N4733A offers asymmetrical thresholds, 5.1 v in one direction and 0.7 v in the other direction.

The steps 52, 53, and so on of the switch-chain 50 can be set as needed. They can be unequal, asymmetrical, having sharp knees or gradual knees. The steps can also include other components to modify their characteristics. Resistors, inductors, and beads in series or in parallel with a threshold switch are good construction of a step. Such step is not shown in a figure because the description is already clear. Advantages of a setting of switch-chain 50 should be experimentally assessed. Presently, typical setting is equal bi-directional steps and typical knee curvature is sharp.

2. An element network 80, comprising elements 82, 84, and so on. The elements are typically capacitive. The elements are connected from each switch to a common terminal 61.

Matrix 60C has at least two main terminals 61 and 62.

Values of the elements are important and can be determined experimentally, by trial and error, starting with some guess values. In other words, the setting of diode-chain and the values of the elements are experimentally designed to approximate the optimum stabilization relationship of the amplifier under test.

If the elements are capacitors, one way to perform the determination of capacitor's values is described below. Similar ways can be applicable to different kinds of elements as well. Other more sophisticated ways based on optimum-control principle can be used to determine values of the elements to maximize musicality.

For power amplifiers of 10 watt or more, good starting values are equal capacitance of 6800 pF per step of 1 volt, meaning each step of DV volt is connected to a capacitor of value equals to DV×6800 pF. The first capacitor can be of the same value as the capacitor of the first step.

Four pairs of 1N4936 may be tried initially (with 5 capacitors of 4700 pF each), then add or subtract pairs as sound quality continues to improve. Trimming of capacitors comes next, that is increasing or decreasing, one at a time, the first to the last capacitors by 20% each time until there is no more improvement. Next, the steps are reduced by half by replacing a pair of 1N4936 by two pairs of 1N5819 in series. Capacitors obtained from the previous trimming are also replaced by two capacitors of half value to accommodate the doubled number of steps. Now, repeat the above trimming of capacitors, using 10% incremental capacitance change. Add or subtract diode pairs as needed.

For program players (such as Compact Disk players, Video Cassette recorders), good starting capacitance is equal capacitance of 1000 pF per step of 1 volt. Five pairs of BAT 42 may be tried initially (with 6 capacitors of 360 pF each). Trimming procedure is the same as described above for power amplifiers.

Figure 7:
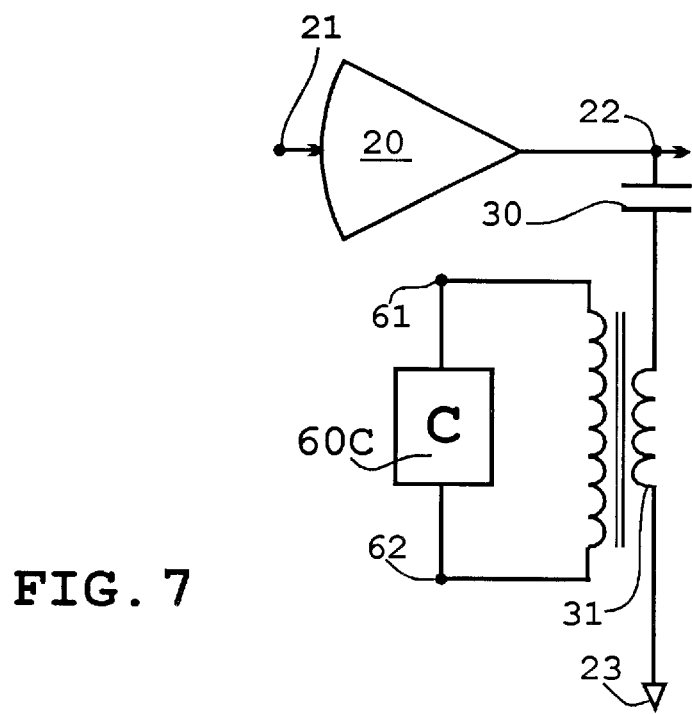
FIG. 7 shows a transformer for achieving smaller voltage steps.

Presently, since there are no available threshold switches that offer much smaller step than BAT 42, a transformer may be used to reduce step size, as shown in FIG. 7.

3. Auxiliary components include a low-pass device 31 and a high-pass device 30. Typically an inductor 31 is connected in parallel with a matrix 60-(60C in FIG. 5). A capacitor 30 is in series with inductor 31.

The resulting apparatus Z, having two terminals, is inserted between output 22 and ground 23. To which terminal (61 or 62) capacitor 30 is connected to is irrelevant since both ways are electrically equivalent. Which of the terminals of apparatus Z goes toward ground is also irrelevant.

Value of capacitor 30 should be about twice the total capacitance of matrix 60C (about 0.039 micro-F, to be readjusted up or down, later). Value of inductor 31 is kept initially at about 15 micro-H, then readjusted later.

Other components (see FIG. 9E) can be added such as inductor 33 (about 1.5 micro-H), capacitor 34 (about 4700 pF), zener diodes 36 (about 7 v), ferrite bead 35 (about 60 ohm at 100 MHz), as shown in FIG. 5. The values in parentheses are for a particular 100W amplifier. They can be trimmed for evaluation and be deleted if they are not cost-effective. Therefore, depending on the performance of apparatus Z, auxiliary components can be included properly, based on cost effectiveness, and the necessity of frequency passing or blocking.

Figure 6:
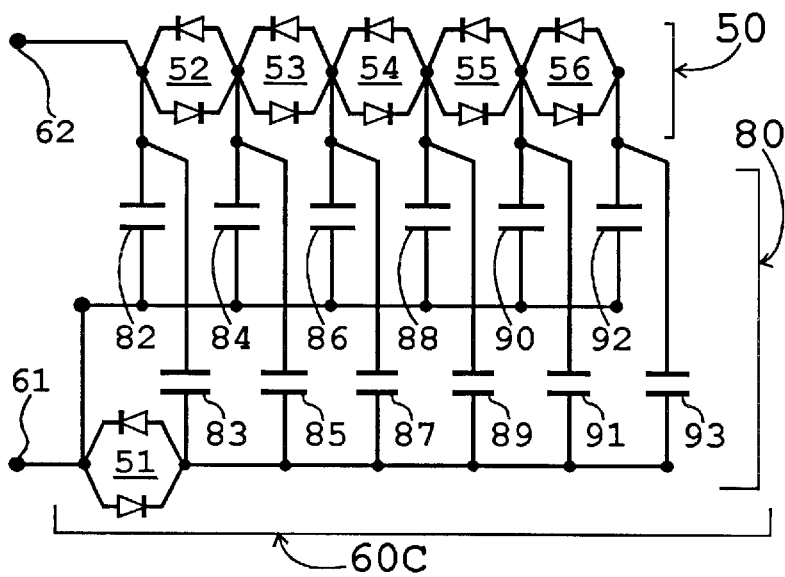
FIG. 6 shows a construction of a preferred matrix using less diode.

Description—FIG. 6

In many applications, it is desirable to use small steps for diode-chain 50. The resulting increase in number of diodes can be reduced by a construction similar to FIG. 6.

In FIG. 6, the switch-chain 50 has been turned downside up in order to see more clearly the complex construction. However, the operation of this matrix 60C is identical to its counterpart in FIG. 5. The position (up or down) of the switch-chain is functionally irrelevant.

Typically, the requirement for a 100W-power amplifier is ten steps of 0.35 v each, using ten pairs of 1N5819. FIG. 6 shows how to reduce 10 pairs of 1N5819 to only 5 pairs of 1N4936 (0.7 v each) and 1 pair of 1N5819 (0.35 v).

In FIG. 6, the main and coarser diode-chain 50 is composed of 1N4936-diode pairs 52, 53, 54, 55, 56. The number of required elements remains the same, namely 11 capacitors from 82, 83, up to 92 (capacitor 93 can be added if needed). However, the capacitors are no longer connected to the common terminal 61 as shown in FIG. 5. Instead, as shown in FIG. 6, only 6 capacitors, namely 82, 84, 86, 88, 90, 92 are connected to terminal 61. The other 5 capacitors, namely 83, 85, 87, 89, 91 are connected through a common 1N5819-pair, pair 51, then to terminal 61. The resulting matrix, matrix 60C of FIG. 6, has substantially the same diode-chain and capacitors as the original matrix constructed by 10 pairs of 1N5819.

Comparing each capacitor value and its voltage position with the original capacitor value and its original voltage position can establish the equivalence. For example, capacitor 87 is opposed by a total step consisting of steps 52, 53 and 51, equivalent to 5 steps of 1N5819-diode pairs. Its value should be the same as the original capacitor at same voltage position, i.e. the fifth position of the original diode-chain.

The principle for reduction of required number of diodes is applicable to other divides as well. For example, if available, a diode pair having a step of 0.53 volt can be connected (not shown) to terminal 61 of FIG. 6, in addition to diode pair 51. Such addition of only one part reduces step size between as many as six pairs of adjacent elements. Indeed, the free end of this additional part provides a common location for 6 more capacitors split (by half) from 6 original capacitors, say capacitors 82, 84, 86, 88, 90, 92.

If another available diode pair of step 0.88 v is added (not shown) to terminal 61 of FIG. 6, six remaining capacitors can be split by half. Therefore, an addition of only two pairs of diodes to FIG. 6 can reduce overall step size by about half, to about 0.18 v from about 0.35 v.

Description—FIG. 7

As discussed above (FIG. 5), program players may require 5 pairs of BAT 42. If half size step is desired, 10 pairs of BAT 42 will be needed in a transformer circuit of FIG. 7 (turn ratio of 2). Adopting the construction of FIG. 6, 5 pairs of 1N4148 and a pair of BAT 42 can replace the 10 pairs of BAT 42. Depending on need and availability of threshold switches, different step sizes may be obtained by selection of turn ratio and switches. New values for capacitors should be recalculated by transformer formulas.

An autotransformer may replace the transformer of FIG. 7. Primary inductance and leakage inductance should be adjusted, 33 micro-H and 1% leakage are good starting values. High frequency performance of the transformer is important; it must be good up to at least 2 MHz because frequency of unstable voltages may reach 10 MHz.

Figure 8A:
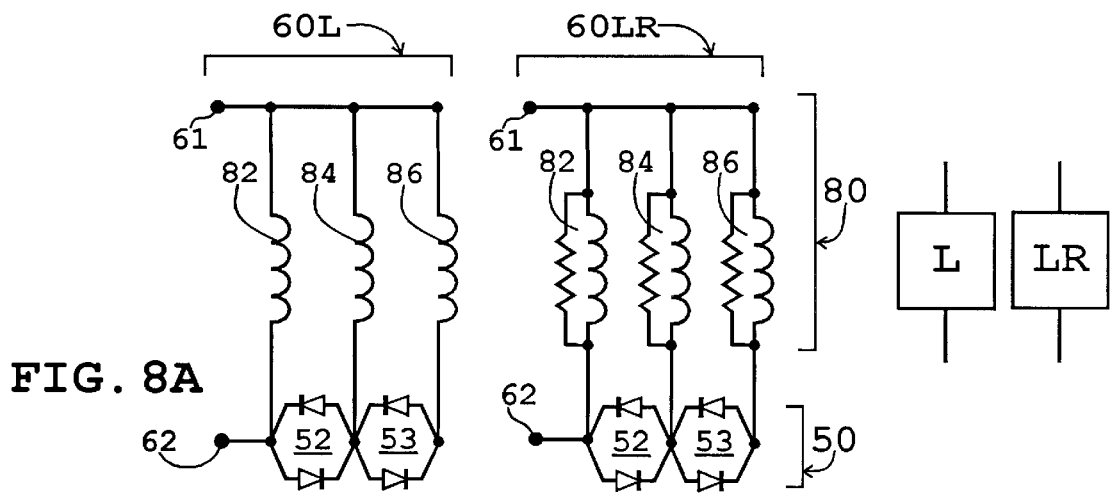
FIGS. 8A to 8C show possible embodiments of matrices, using a variety of elements.
Figure 8B:
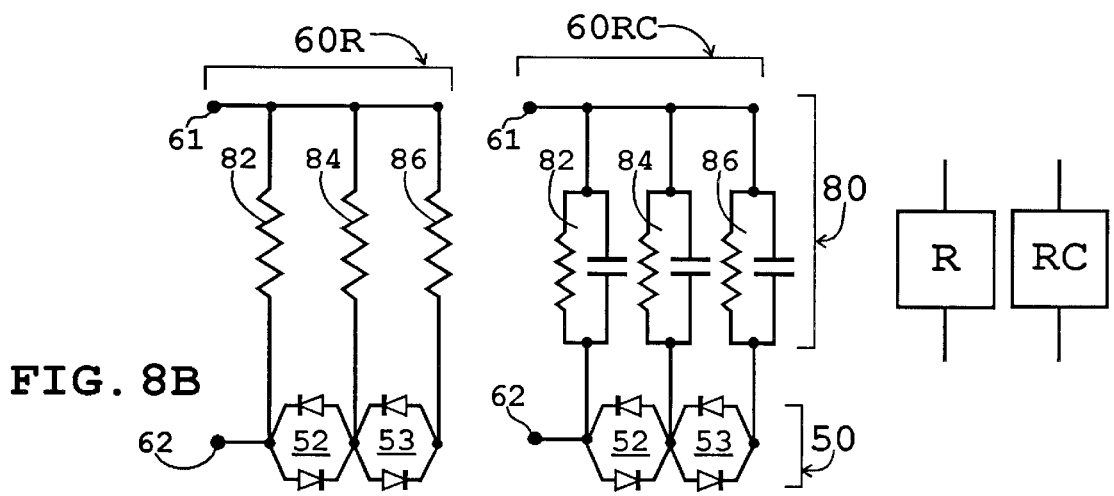
Figure 8C:
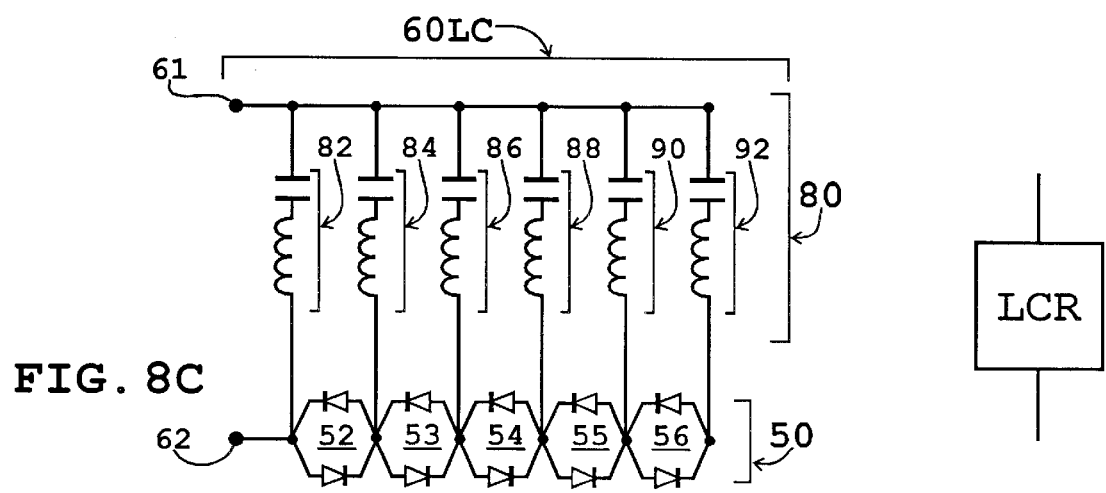

Description—FIGS. 8A, 8B, 8C

Typical elements are capacitive C, but other kinds of matrices may be used.

FIGS. 8A, 8B, 8C show some possible elements for the construction of matrices. Other elements are inductive L, resistive R, and combinations of LCR. Corresponding matrices are 60L, 60R, 60LC (60LCR is not shown because the R can be at many locations, such as parallel to C, to L, or to both). More exotic devices can also be used for switch-chain 50 and/or for the element network 80. For example: variable capacitance diodes, field-effect current regulator diodes, other constant current devices can substantially modify the impedance of the elements and/or the knee curvature of the steps.

FIGS. 8A, 8B 8C are shown with threshold switches in series, however they are exactly applicable to transistor/threshold switches in parallel. A simple substitution for the switches would suffice. In practice, the matrices should contain both kinds of switches for more flexibility and less cost. For example, in the FIGS. 9A to 9F described below, matrix 60C1 should use transistor switches controlled by a simplified computer and matrices 60L, 60C2 should use diodes.

Description—FIGS. 9A to 9F

Combinations of matrices are possible alternatives for simple matrices. Possible combinations are numerous. However, cost-effective are combinations of capacitor and inductor matrices, in series resonance and in parallel resonance. Experiments show that Resonant circuits are cost effective, either constructed with simple capacitor-inductor or with the above matrices.

Resistors are not particularly cost effective, possibly because the diodes already play the role of resistive damping. The matrix networks proposed here represent an early stage of evaluation. Better designs will emerge as more evaluations are done in the practice of this invention. Eventually, a computer simulation will be developed for fast evaluation of the matrices.

Figure 9A:
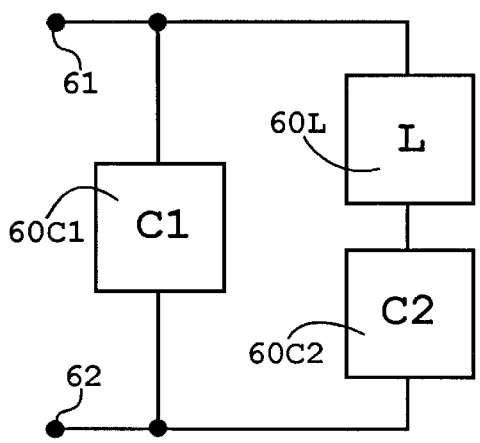
FIGS. 9A to 9F show some combinations of matrices.

In FIG. 9A a series-resonant combination of matrix 60C2 and matrix 60L parallels matrix 60C1. The resulting complex matrix can replace matrix 60C of FIGS. 1, 2, 3, 4, and so on.

It is convenient to group components into different types of matrices in order to see clearly where the design aims at (here the design aims at formation of resonant circuits). However, the whole complex matrix can be considered a matrix having complex connecting parts, not necessarily neatly grouped. Reduction of number of diodes should be tried by careful examination and look for possibilities of sharing some diodes with many elements. However, the nature of the circuit may change because of diode sharing, but the resulting cost saving may justify circuit changes.

Figure 9B:
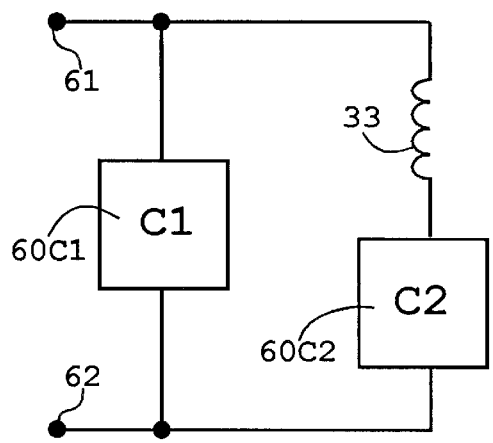
Figure 9C:
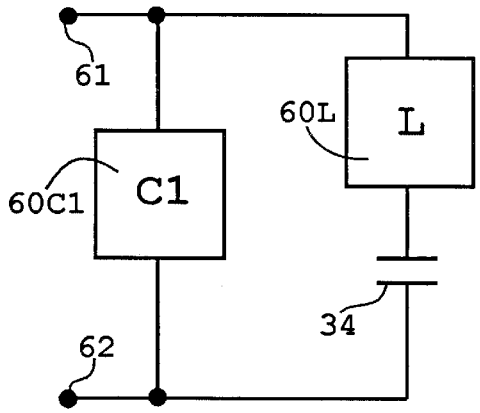
Figure 9D:
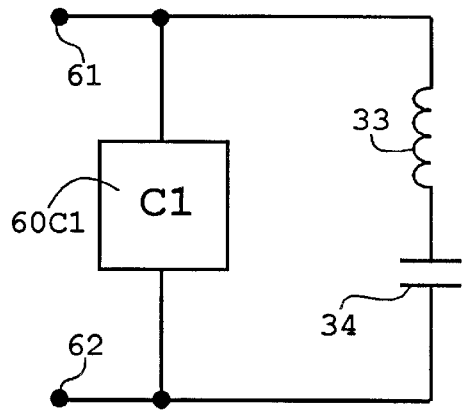

FIGS. 9B, 9C and 9D are essentially FIG. 9A with different simplification of matrices 60C2 and 60L, for cost/performance trade off.

Matrix 60L of FIG. 9A becomes a simple inductor 33 of FIG. 9B.

Matrix 60C2 of FIG. 9A becomes a simple capacitor 34 of FIG. 9C.

Matrix 60L and matrix 60C2 of FIG. 9A become respectively simple inductor 33 and simple capacitor 34 of FIG. 9D.

Figure 9E:
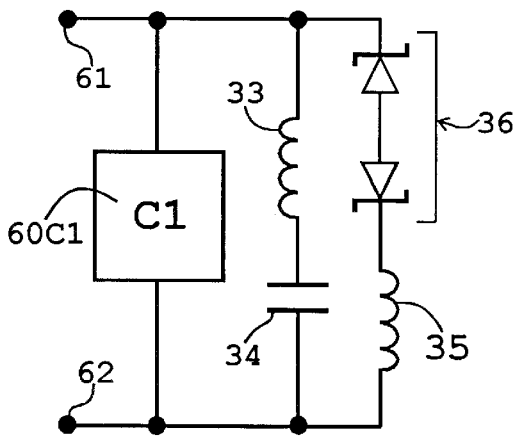

FIG. 9E is FIG. 9D with an additional simplified matrix consisting of a pair of zener diodes 36 and a ferrite bead 35. Simplified matrices may be considered as auxiliary components since the distinction between them becomes blurred.

Figure 9F:
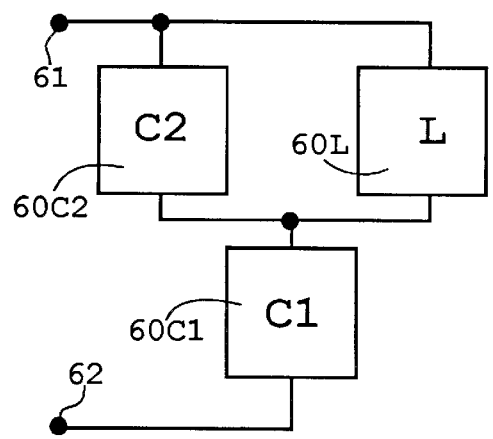

The parallel-resonant pair of matrices 60L and 60C2 of FIG. 9F is in series with matrix 60C1. The simplifications of matrices applicable to FIG. 9A are also applicable to FIG. 9F (simplifications to FIG. 9F are not shown because the analogy is already clear).

Operation—Change of Impedance in Response to a Signal

The operation of the apparatus for stabilizing amplifiers comes from guiding theoretical considerations. Stabilization components should be frequency dependent, but should also be dependent upon other amplifier parameters. Therefore the apparatus must have controllable (or adjustable) impedance. One way to change the impedance in a desirable way is the use of controllable switches for the formation of different circuit configurations in a network. The choice of controllable switches depends on where the controlling signal comes from. Starting with low cost threshold switches that can change states only by the unstable voltage applied across its terminals (FIGS. 2, 5). The witch can graduate up to a three-terminal transistor switch, adding more freedom to the choice of unstable signals (FIG. 1). The upgrading can proceed further into monitoring of parameters of the amplifier and computer switch control using sophisticated codes for possible predictive capability (FIG. 3). In principle, the degree of stabilization depends mainly on the cost of the stabilization apparatus.

Overall principle of impedance variation in relationship with voltage amplitude is already explained in the description of FIGS. 1, 2. However, more insight into the nature of the impedance of apparatus Z is presented below. Particularly the impedance of FIG. 5, because most experimental works has been done with an apparatus of FIG. 5.

More accurate impedance moduli and phase angles are not discussed, only a simplified presentation of how the impedance changes with the voltage. The impedance between the terminals 61 and 62 of apparatus Z shown in FIGS. 1, 2, 3, 4, 5 and so on is nonlinear, meaning the impedance depends on voltage (or current) and/or time.

First simplification is linear approximation.

By definition, impedance=(voltage across a device)/(current through the device). Conforming to this definition, the term impedance is associated with the locations where the voltage is measured. To be accurate, impedance is determined between two terminals. In the above discussions, impedance is loosely given to apparatus Z. In fact it should be specified that the impedance of Z is between terminals 61 and 62. More precise qualification should also be given to the path of the current. However, current path is implied to be total current through the conducting elements. With nonlinear devices, current and/or voltage are non-sinusoidal; the fundamental frequency is used in approximated analysis. The harmonics generated by the device are ignored. For example, if the driving voltage is sinusoidal V at a frequency f, then the current I' is non-sinusoidal. Ignoring the harmonics of the current, the current at the fundamental frequency f is 1, and the linear impedance Z is V/I.

Second simplification is to ignore auxiliary components.

As high frequencies are concerned, inductor 31 approximates an open circuit and capacitor 30 approximates a short circuit. High frequencies are frequencies higher than the upper boundary of the bandwidth of interest. Thus, as high frequencies are concerned, apparatus Z can be approximated by matrix 60C.

Third simplification is to consider one unstable frequency.

Let X1, X2, X3, X4, X5, and X6 represent respectively the impedance moduli of capacitors 82, 84, 86, 88, 90, and 92. Since the values of capacitors remain unchanged, their impedances depend only on frequency. For each given frequency, the impedances X1 to X6 are constant.

Let V represents the unstable voltage across terminals 61 and 62.

When V starts to increase from zero, only capacitor 82 is in conduction (it is so always), therefore the impedance is only X1. When V breaks over the first step of diode pairs 52, capacitor 84 starts conducting, therefore the impedance is now X1 in parallel with X2. When V breaks over the first and the second steps of diode pairs 52, 53, capacitor 86 starts conducting, therefore the impedance is now X1, X2 and X3 in parallel. The impedance decreases. And so on until V is larger than steps of all diode pairs combined. Now all capacitors are in conduction, the impedance is lowest.

V starts decreasing from maximum. First, capacitor 92 stops conducting, then capacitor 90, and so on, until capacitor 84 stops conducting. The impedance increases. V starts becoming negative. Again, capacitor 84 starts conducting first, then capacitors 86, 88 and so on, until all capacitors are conducting. The impedance decreases again. V starts increasing from minimum. First, capacitor 92 stops conducting, then capacitor 90, and so on, until capacitor 84 stops conducting. V is now in the neighborhood of zero, a cycle of oscillation of V is completed.

The parallel configurations of elements change during an oscillation cycle. The current-voltage phase relationship is even more intractable. In FIG. 5, the chosen values for each voltage step 52, 53, 54, 55, 56 an the value of each capacitor 82, 84, 86, 88, 90, 92 define a design for a step-wise approximation to stabilization relationship. Finer steps produce better approximation.

If some switches are also controlled by signals other than the voltages across its terminals, the non-linearity is even more complex (FIG. 3A). The impedance is not only voltage dependent but is also time-dependent. The impedance changes during an oscillation of the voltage across its terminals, and at the same time, modulated by the signal that controls transistor switches.

Conclusion

Accordingly, the reader will see that prior art amplifiers are not stable, and that stabilization of feedback controlled-amplifiers is possible and leads to better sound quality. There may be many ways to construct and hook-up an apparatus according to the method of this invention. However, the basic apparatus disclosed in FIG. 1 is effective toward reducing instabilities. It is not enough to insert variable impedance in the amplifier circuitry. This can make instabilities worst. The impedance must be able to change in relation to instabilities, according to specific code. Further development will lead to even better sound. However, the present tested embodiments already improve musicality of electronic sound systems beyond the best prior options.

Although the description above contains specificities, these should not be construed as limiting the scope of the invention but as merely providing illustrations of some of the presently preferred embodiments of this invention. For example:

Inserting apparatus Z between output and ground (as shown in FIG. 1) is suitable as an add-on system. But other possibilities exist, such as the insertion between any of the following locations:

- an output of any amplifying stage of the amplifier, including the last one,
- ground, feedback terminal, input terminal, terminals of power supplies, transistor control terminals,
- terminals for "constant-current" source in the common emitter of emitter-coupled difference amplifiers.

All of the above mentioned locations have strong influence on the open-loop gain, modulus wise and phase wise. The shifting impedance (in the right direction) of an apparatus inserted therein will steer the open-loop gain away from the value of −1.

Amplifier circuits vary widely. Therefore alternative designs should be explored to use more effectively the apparatus at locations other than output and ground.

Thus the scope of the invention should be determined by the appended claims and their legal equivalents, rather than by the examples given.

I claim:

1. An apparatus for stabilizing a feedback-controlled amplifier, comprising:

(a) a matrix having at least:
an element network connected to a first terminal and having at least an element,
a switch-chain connected to a second terminal and having at least a threshold switch connected to the element, (b) means for connecting the terminals to at least two locations in the circuitry of the amplifier, and (c) wherein one of the locations has an unstable voltage, whereby fluctuations of the unstable voltage will be reduced by designing the value of the element into a stabilization relationship with said unstable voltage.

2. The apparatus of claim 1 wherein the element includes a capacitive device.

3. The apparatus of claim 1 wherein the matrix is further connected to a resonant circuit.

4. The apparatus of claim 1 wherein the switch include a diode.

5. The apparatus of claim 1 wherein the matrix further includes a diode connected to the first terminal.

6. The apparatus of claim 1 further includes a low-pass means in parallel with the matrix, and wherein the means for connecting the terminals include a high-pass means.

\* \* \* \* \*